US 12,063,821 B2

(12) United States Patent
Ding et al.

(10) Patent No.: US 12,063,821 B2
(45) Date of Patent: Aug. 13, 2024

(54) DISPLAY PANEL

(71) Applicant: WUHAN CHINA STAR OPTOELECTRONICS SEMICONDUCTOR DISPLAY TECHNOLOGY CO., LTD., Hubei (CN)

(72) Inventors: Ke Ding, Hubei (CN); Yu Gu, Hubei (CN)

(73) Assignee: WUHAN CHINA STAR OPTOELECTRONICS SEMICONDUCTOR DISPLAY TECHNOLOGY CO., LTD., Hubei (CN)

( * ) Notice: Subject to any disclaimer, the term of this patent is extended or adjusted under 35 U.S.C. 154(b) by 388 days.

(21) Appl. No.: 17/599,515

(22) PCT Filed: Jul. 16, 2021

(86) PCT No.: PCT/CN2021/106845
§ 371 (c)(1),
(2) Date: Sep. 28, 2021

(87) PCT Pub. No.: WO2023/272799
PCT Pub. Date: Jan. 5, 2023

(65) Prior Publication Data
US 2023/0006014 A1 Jan. 5, 2023

(30) Foreign Application Priority Data
Jun. 30, 2021 (CN) .......................... 202110735901.5

(51) Int. Cl.
*H10K 59/123* (2023.01)
*H10K 59/121* (2023.01)
(Continued)

(52) U.S. Cl.
CPC ......... *H10K 59/123* (2023.02); *H10K 59/121* (2023.02); *H10K 59/122* (2023.02); *H10K 59/80515* (2023.02); *H10K 59/80518* (2023.02)

(58) Field of Classification Search
CPC .... H10K 59/00; H10K 59/121; H10K 59/123; H10K 59/80515; H10K 59/80518; H10K 59/878; H10K 59/8791
See application file for complete search history.

(56) References Cited

U.S. PATENT DOCUMENTS

2003/0201716 A1 10/2003 Yamazaki et al.
2008/0185958 A1 8/2008 Yoon et al.
(Continued)

FOREIGN PATENT DOCUMENTS

CN 104282844 A 1/2015
CN 109786578 A 5/2019
(Continued)

*Primary Examiner* — Robert G Bachner
*Assistant Examiner* — Molly K Reida
(74) *Attorney, Agent, or Firm* — HSML P. C.

(57) ABSTRACT

The present application provides a display panel including a substrate, a thin film transistor layer, an electrode layer, a pixel definition layer, and a light-emitting function layer. layer. An orthographic projection area of the electrode on the substrate is D, an orthographic projection area of an area connecting the light-emitting function portion and the electrode on the substrate is P, and a reflection compensation parameter of the pixel is D/P. A display area comprises a first display area and a second display area. The reflection compensation parameter of the pixel in the first display area is less than the reflection compensation parameter of the pixel in the second display area.

20 Claims, 3 Drawing Sheets

(51) Int. Cl.
*H10K 59/122* (2023.01)
*H10K 59/80* (2023.01)

(56) References Cited

U.S. PATENT DOCUMENTS

| | | |
|---|---|---|
| 2019/0181188 A1 | 6/2019 | Youn et al. |
| 2019/0221767 A1 | 7/2019 | Lee et al. |
| 2019/0379002 A1* | 12/2019 | Abe .................. H10K 59/8051 |
| 2021/0043706 A1 | 2/2021 | Kobayashi |
| 2021/0066415 A1 | 3/2021 | Lee et al. |

FOREIGN PATENT DOCUMENTS

| | | | |
|---|---|---|---|
| CN | 110880528 A | 3/2020 | |
| CN | 112420790 A * | 2/2021 | ......... H01L 27/3244 |
| CN | 112864211 A | 5/2021 | |
| CN | 113113550 A | 7/2021 | |

* cited by examiner

DISPLAY PANEL

FIELD OF INVENTION

This application relates to a display technology field, and particularly to a display panel.

BACKGROUND

In current organic light-emitting display panels on the market, it looks like that a display brightness at an edge of a display area is less than a display brightness at a center of the display area when human eyes look at the center of the display area, which results in a visual brightness difference between the edge and the center of the display area, thereby reducing a display quality of the display panel.

SUMMARY OF DISCLOSURE

An embodiment of the present application provides a display panel, which solves the technical problem of uneven brightness of the display panel caused by different viewing angles in the prior art.

An embodiment of the present application provides a display panel, comprising a substrate; a thin film transistor layer arranged on the substrate; an electrode layer arranged on the thin film transistor layer, wherein the electrode layer comprises a plurality of first electrodes arranged in the first display area which correspond to the first pixels, and a plurality of second electrodes in the second display area which correspond to the second pixels; and a light-emitting function layer arranged on the electrode layer, wherein the light-emitting function layer comprises a plurality of first light-emitting function portions arranged in the first display area which correspond to the first pixels, and a plurality second light-emitting function portions arranged in the second display area which correspond to the second pixels; wherein an orthographic projection area of the first electrode on the substrate is D1, an orthographic projection area of an area connecting the first light-emitting function portion and the first electrode on the substrate is P1, and a reflection compensation parameter of the first pixel is D1/P1; wherein an orthographic projection area of the second electrode on the substrate is D2, an orthographic projection area of an area connecting the second light-emitting function portion and the second electrode on the substrate is P2, and a reflection compensation parameter of the second pixel is D2/P2; and wherein the reflection compensation parameter of the first pixel is less than the reflection compensation parameter of the second pixel.

Optionally, in some embodiments of the present application, the first display area is close to a central area of the display panel, and the second display area is far from the central area of the display panel.

Optionally, in some embodiments of the present application, the display panel further comprises a plurality of pixels arranged in the display area, the display area comprising the first display area and the second display area; and a reflection compensation parameter of the pixels gradually increases along a direction from a center of the display area to an edge of the display area.

Optionally, in some embodiments of the present application, the reflection compensation parameter of the plurality of the second pixels in the second display area gradually increases along a direction from the center of the display area to the edge of the display area.

Optionally, in some embodiments of the present application, the second display area surrounds the first display area.

Optionally, in some embodiments of the present application, the second display area is adjacent to the first display area, and a side of the second display area away from the first display area is in a distance of less than or equal to 30 mm to the first display area.

Optionally, in some embodiments of the present application, the reflection compensation parameter of the first pixels ranges from 1 to 1.4, and the reflection compensation parameter of the second pixels ranges from 1.4 to 2.

Optionally, in some embodiments of the present application, the P1 is equal to the P2, and the D1 is less than the D2.

Optionally, in some embodiments of the present application, the display panel further comprises a pixel definition layer arranged on the electrode layer, and the pixel definition layer is provided with a first opening and a second opening along a thickness direction; wherein the first light-emitting function portion is arranged in the first opening, the first opening exposes the first electrode, the first light-emitting function portion is connected to the first electrode through the first opening; wherein the second light-emitting function portion is arranged in the second opening, the second opening exposes the second electrode, the second light-emitting function portion is connected to the second electrode through the second opening; and wherein an opening size of the first opening is the same as an opening size of the second opening.

Optionally, in some embodiments of the present application, the display panel further comprises a driver chip, wherein the driver chip is arranged close to the first display area, and the driver chip is away from the second display area.

An embodiment of the present application provides a display panel including a plurality of first pixels arranged in a first display area and a plurality of second pixels arranged in a second display area, wherein the display panel comprises a substrate; a thin film transistor arranged on the substrate; a first electrode arranged on the thin film transistor, wherein a plurality of first electrodes are arranged in the first display area which correspond to the first pixels; a second electrode arranged on a layer the same as the first electrode, wherein a plurality of second electrodes are arranged in the first display area which correspond to the second pixels which correspond to the second pixels; a first light-emitting function layer arranged on the first electrode and the second electrode and corresponding to the first pixels, wherein a plurality of first light-emitting function portions are arranged in the first display area; and a second light-emitting function layer arranged on the first electrode and the second electrode and corresponding to the second pixels, wherein a plurality of second light-emitting function portions are arranged in the second display area; wherein an orthographic projection area of the first electrode on the substrate is D1, an orthographic projection area of an area connecting the first light-emitting function portion and the first electrode on the substrate is P1, and a reflection compensation parameter of the first pixel is D1/P1; wherein an orthographic projection area of the second electrode on the substrate is D2, an orthographic projection area of an area connecting the second light-emitting function portion and the second electrode on the substrate is P2, and a reflection compensation parameter of the second pixel is D2/P2; wherein the reflection compensation parameter of the first pixel is less than the reflection compensation parameter of the second pixel; and wherein the first display area is close to a central area of the display panel, and the second display area is far from the central area of the display panel.

Optionally, in some embodiments, the display panel further comprises a plurality of pixels arranged in the display area, the display area comprising the first display area and the second display area; and a reflection compensation parameter of the pixels gradually increases along a direction from a center of the display area to an edge of the display area.

Optionally, in some embodiments of the present application, the reflection compensation parameter of the plurality of the second pixels in the second display area gradually increases along a direction from the center of the display area to the edge of the display area.

Optionally, in some embodiments of the present application, the second display area surrounds the first display area.

Optionally, in some embodiments of the present application, the second display area is adjacent to the first display area, and a side of the second display area away from the first display area is in a distance of less than or equal to 30 mm to the first display area.

Optionally, in some embodiments of the present application, the reflection compensation parameter of the first pixels ranges from 1 to 1.4, and the reflection compensation parameter of the second pixels ranges from 1.4 to 2.

Optionally, in some embodiments of the present application, the P1 is equal to the P2, and the D1 is less than the D2.

Optionally, in some embodiments of the present application, the display panel further comprises a pixel definition layer arranged on the electrode layer, and the pixel definition layer is provided with a first opening and a second opening along a thickness direction; wherein the first light-emitting function portion is arranged in the first opening, the first opening exposes the first electrode, the first light-emitting function portion is connected to the first electrode through the first opening; wherein the second light-emitting function portion is arranged in the second opening, the second opening exposes the second electrode, the second light-emitting function portion is connected to the second electrode through the second opening; and wherein an opening size of the first opening is the same as an opening size of the second opening.

Optionally, in some embodiments of the present application, the P1 is equal to the P2, and D1 is greater than the D2.

Optionally, in some embodiments of the present application, the display panel further comprises a driver chip, wherein the driver chip is arranged close to the first display area, and the driver chip is away from the second display area.

A beneficial effect of the present application is a ratio D/P represented as dividing an orthographic projection area D of the electrode in each pixel on the substrate by an orthographic projection area P of an area connecting the light-emitting functional layer and the electrode on the substrate in each pixel is defined as a reflection compensation parameter of the pixel. By adjusting the reflection compensation parameters of the pixels on the first display area and/or the second display area, a brightness difference between the first display area and the second display area is improved so that a visual brightness of a display panel is uniform.

BRIEF DESCRIPTION OF DRAWINGS

In order to more clearly illustrate technical solutions in embodiments of the present disclosure, a brief description of accompanying drawings used in a description of the embodiments will be given below. Obviously, the accompanying drawings in the following description are merely some embodiments of the present disclosure. For those skilled in the art, other drawings may be obtained from these accompanying drawings without creative labor.

DETAILED DESCRIPTION

Technical solutions in the embodiments of the present application will be clearly and completely described below in conjunction with the drawings in the embodiments of the present application. Obviously, the described embodiments are only a part of the embodiments of the present application, rather than all the embodiments. Based on the embodiments in this application, all other embodiments obtained by those skilled in the art without creative work shall fall within the protection scope of this application.

Embodiment of the application disclose a display panel comprising a substrate, a thin film transistor layer, an electrode layer, a pixel definition layer, and a light-emitting function layer. A plurality of pixels are arranged on the display area, and each of the plurality of the pixels comprises a thin film transistor, an electrode, and a light-emitting function portion. The thin film transistor is arranged in the thin film transistor layer. The electrode is arranged on the electrode layer. The light-emitting function portion is arranged in the light-emitting function layer. An orthographic projection area of the electrode on the substrate is D, an orthographic projection area of an area connecting the first light-emitting function portion and the electrode on the substrate is P1, and a reflection compensation parameter of the first pixel is D/P. A display area comprises a first display area and a second display area. The reflection compensation parameter of the pixel in the first display area is less than the reflection compensation parameter of the pixel in the second display area. In the present application, by adjusting the reflection compensation parameters of the pixels on the first display area and/or the second display area, a brightness difference between the first display area and the second display area is improved so that a visual brightness of a display panel is uniform.

Figure 1:
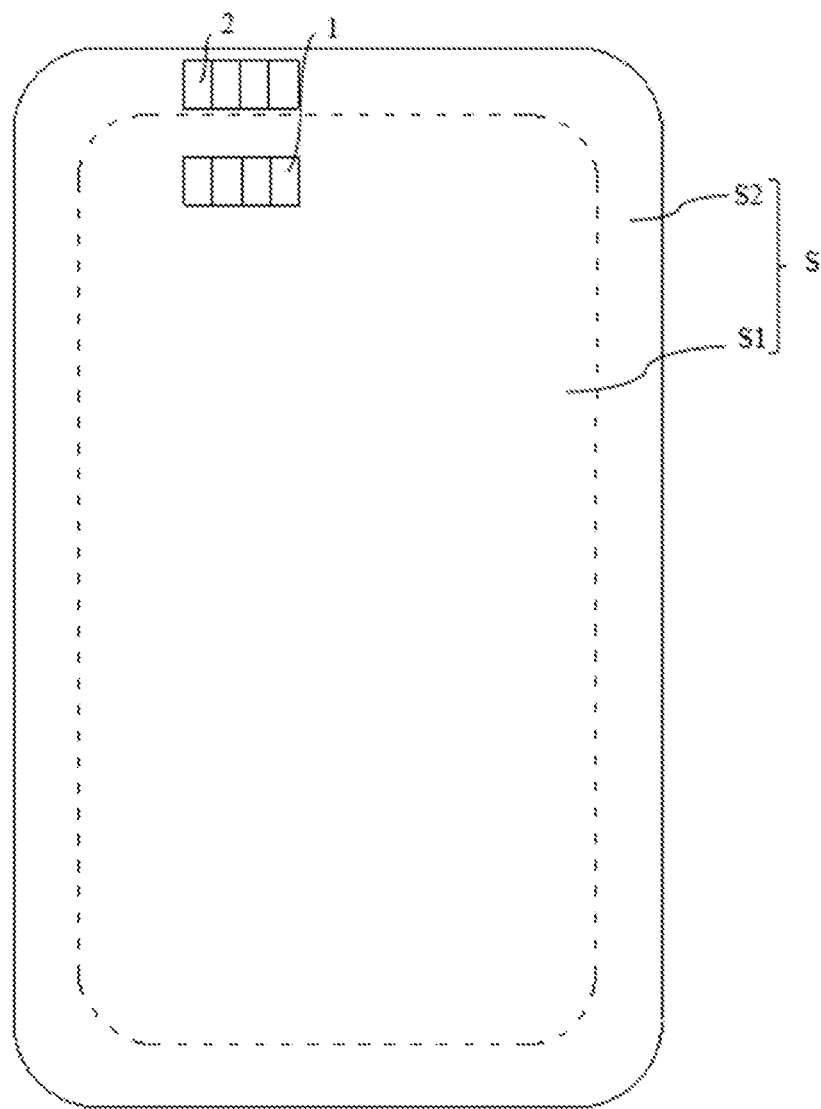
FIG. 1 is a schematic structural diagram of a display area of a display panel provided by a first embodiment of the present application.
Figure 2:
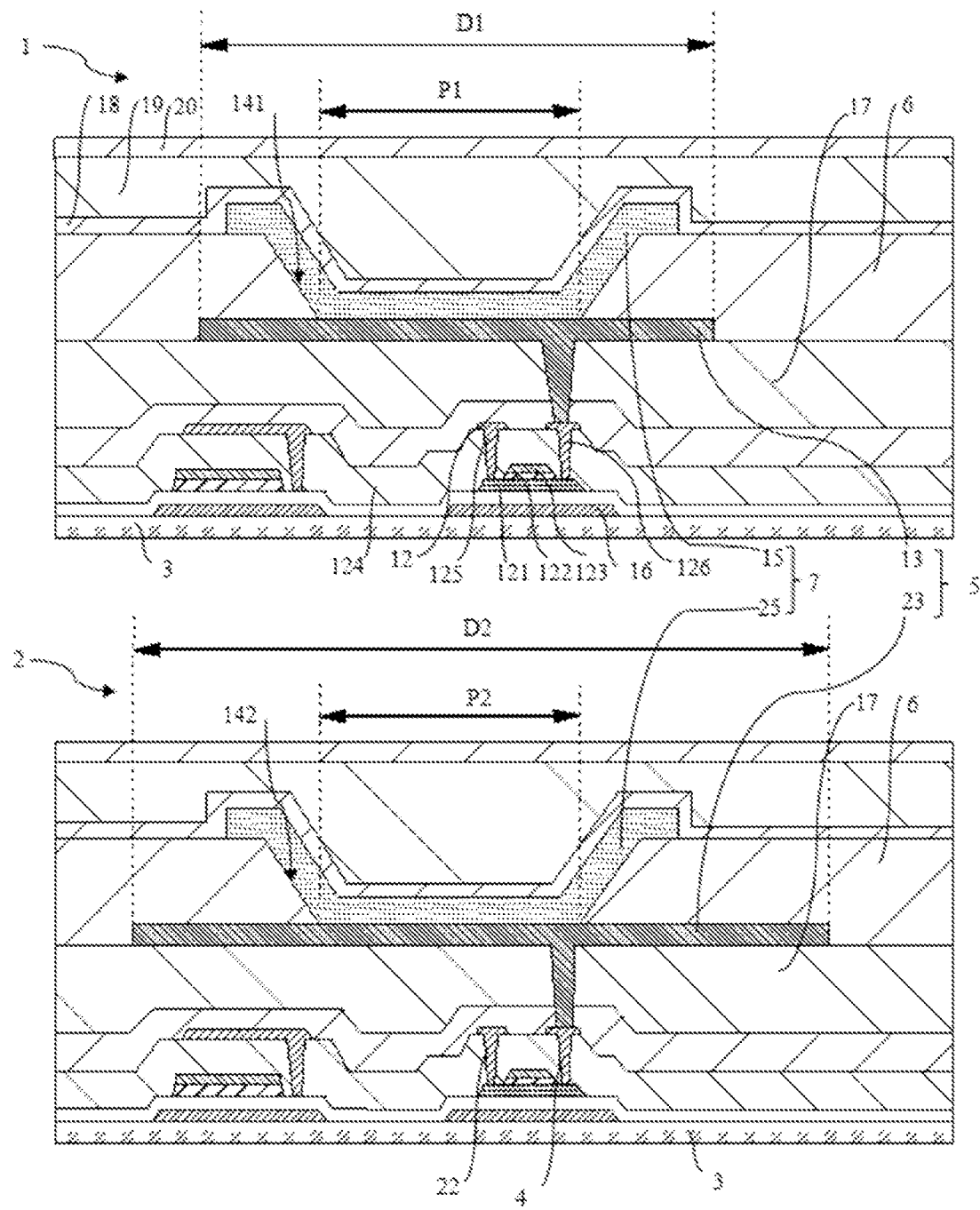
FIG. 2 is a schematic cross-sectional view of a first pixel and a second pixel in the display panel provided in FIG. 1.
Figure 3:
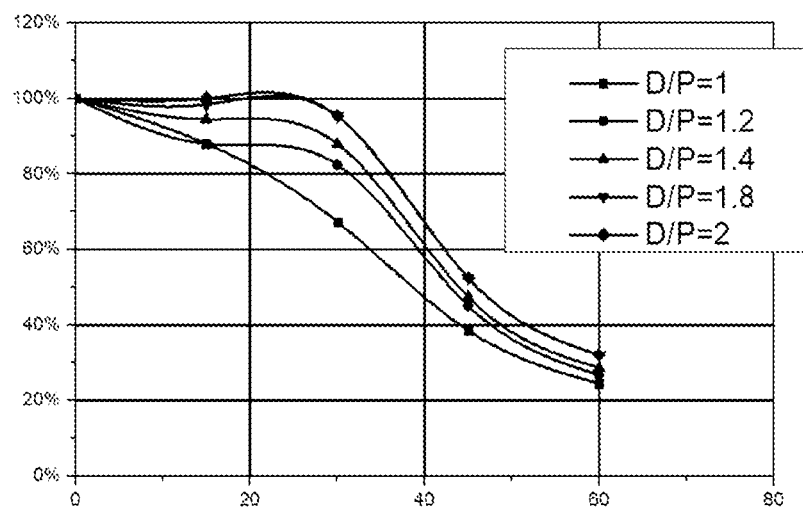
FIG. 3 is a brightness attenuation curve of the display panel provided in FIG. 1 corresponding to different reflection compensation parameters.

A first embodiment provided by the present application is shown in FIG. 1 to FIG. 3, which provides a display panel comprises a display area S. In the present embodiment, the display area S is divided into a first display area S1 and a second display area S2 arranged around the first display area S1 so as to improve a visual brightness difference between a central area and an edge area of the display area S. The second display area S2 is adjacent to the first display area S1. A plurality of pixels for displaying light emission are arranged on the display area S. Specifically, a plurality of first pixels 1 are arranged on the first display area S1. A plurality of second pixels 2 are arranged on the second display area S2.

With reference to a cross-sectional view of the pixel shown in FIG. 2, the display panel comprises a substrate 3, a thin film transistor layer 4, an electrode layer 5, a pixel definition layer 6, and a light-emitting function layer 7. The thin film transistor layer 4 is arranged on the substrate 3. The electrode layer 5 is arranged on the thin film transistor layer 4 in an insulating manner. The light-emitting function layer 7 is arranged on the electrode layer 5. The pixel definition layer 6 is arranged on the electrode layer 5.

The first pixel 1 comprises a first thin film transistor 12 arranged on a substrate 3, a first electrode 13 connected to the first thin film transistor 12, and a first light-emitting function portion 15 arranged on the first electrode 13.

The substrate 3 is a flexible substrate in this embodiment. The substrate 3 can be made of organic insulating materials such as polyimide (PI) and/or polyethylene terephthalate (PET) that can isolate water vapor and oxygen.

The first thin film transistor 12 is arranged in the thin film transistor layer 4. The first thin film transistor 12 is arranged in the first display area S1 and corresponds to the first pixel 1. The first thin film transistor 12 comprises an active layer 121, a gate insulating layer 122, a gate 123, a first insulating layer 124, a source 125 and a drain 126. A light-shielding layer 16 for protecting the active layer 121 from external light can also be arranged between the first thin film transistor 12 and the substrate 3. A planarization layer 17 is arranged on the first thin film transistor 12. The planarization layer 17 is used to level a height difference caused by the aforementioned structure to obtain a planar surface.

The first electrode 13 is the electrode layer 5 on the planarization layer 17. The first electrode 13 is arranged in the first display area S1 which corresponds to the first pixel 1. An orthographic projection area of the first electrode 13 on the substrate 3 is D1. The first electrode 13 is an anode. The first electrode 13 is formed by stacking three layers of conductive materials. Specifically, a conductive material of the first layer and a conductive material of the third layer may be transparent conductive materials, such as ITO. A second layer of conductive material can be a metal with higher light reflectivity, such as silver. The first electrode 13 is electrically connected to the first thin film transistor 12.

The pixel definition layer 6 has a first opening 141 corresponding to the first electrode 13. The first opening 141 penetrates the pixel definition layer 6 along a thickness direction of the pixel definition layer 6. The first opening 141 is used for accommodating the first light-emitting function portion 15. A side wall of the first opening 141 is inclined.

The first light-emitting function part 15 is arranged on the light-emitting function layer 7. The first light-emitting function portion 15 is arranged in the first display area S1 and corresponds to the first pixel 1. The first light-emitting function portion 15 is arranged on the first opening 141. The first light-emitting function portion 15 covers the inclined sidewall of the first opening 141 and the first electrode 13 exposed by the first opening 141. The first light-emitting function portion 15 arranged on the inclined side wall of the first opening 141 is inclined correspondingly. The first light-emitting function portion 15 is connected to the first electrode 13 through the first opening 141. An orthographic projection area of an area connecting the first light-emitting function portion and the first electrode on the substrate 3 is P1. In the present embodiment, the area connecting the first light-emitting function portion 15 and the first electrode 13 is also an opening area on a side of the first opening 141 close to the first electrode 13.

A reflection compensation parameter of the first pixel 1 is defined as a ratio D1/P1 of the D1 and the P1. The reflection compensation parameter D1/P1 is used to characterize a reflection ability of the first electrode 13 in the first pixel 1 to the light emitted by the light-emitting function portion 15.

The second pixel 2 and the first pixel 1 are both arranged on the substrate 3. The second pixel 2 comprises a second thin film transistor 22 arranged on the substrate 3, a second electrode 23 connected to the second thin film transistor 22, and a second light-emitting function portion 25 arranged on the second electrode 23.

In the present embodiment, the second thin film transistor 22 and the first thin film transistor 12 have the same structure. The second thin film transistor 22 is arranged in the second display area S2 and corresponds to the second pixel 2. It can be understood that in other specific embodiments of the present application, the second thin film transistor 22 may adopt a structure different from that of the first thin film transistor 12, which is not specifically limited herein.

The planarization layer 17 covers the second thin film transistor 22 to form a planar surface.

The second electrode 23 is arranged on the planarization layer 17. The second electrode 23 is arranged in the second display area S2 and corresponds to the second pixel 2. An orthographic projection area of the second electrode 23 on the substrate 3 is D2. The orthographic projection area D2 of the second electrode 23 on the substrate 3 is larger than the orthographic projection area D1 of the first electrode 13 on the substrate 3. That is, a size of the second electrode 23 is larger than a size of the first electrode 13 so that the second electrode 23 can receive and reflect more light. The second electrode 23 has a stronger ability to reflect light than the first electrode 13.

The pixel definition layer 6 has a second opening 142 corresponding to the second electrode 23. The second opening 142 is used for accommodating the second light-emitting function portion 25. The second opening 142 penetrates the pixel definition layer 6 along the thickness direction of the pixel definition layer 6. A side wall of the second opening 142 is inclined.

The second light-emitting function portion 25 is arranged on the second opening 142. The second light-emitting function portion 25 is arranged in the second display area S2 and corresponds to the second pixel 2. The second light-emitting function portion 25 covers the inclined sidewall of the second opening 142 and the second electrode 23 exposed through the second opening 142. The second light-emitting function portion 25 arranged on the inclined side wall of the second opening 142 is inclined correspondingly. The second light-emitting function portion 25 is connected to the second electrode 23 through the second opening 142. The orthographic projection area of an area connecting the second light-emitting function portion 25 and the second electrode 23 on the substrate 3 is P2. In the present embodiment, the area connecting the second light-emitting function portion 25 and the second electrode 23 is also an opening area on the side of the second opening 142 close to the second electrode 23. The orthographic projection area P2 of the area connecting the second light-emitting function portion 25 and the second electrode 23 on the substrate 3 is equal to the orthographic projection area P1 of the area connecting the first light-emitting function portion 15 and the first electrode 13 on the substrate 3. That it, the second light-emitting function portion 25 and the first light-emitting function portion 15 have similar light-emitting ability.

In addition, the display panel further comprises a first encapsulation layer 18, a second encapsulation layer 19, and a third encapsulation layer 20 covering the first light-emitting function portion 15 and the second light-emitting function portion 25. Among them, the first encapsulation layer 18 is made of common inorganic materials such as SiNx and/or SiOx that can isolate water and oxygen. The second encapsulation layer 19 adopts an organic encapsulation material that can isolate water and oxygen. The third encapsulation layer 20 uses common inorganic materials such as SiNx and/or SiOx that can isolate water and oxygen.

A reflection compensation parameter of the second pixel 2 is defined as a ratio D2/P2 of the D2 to the P2. The reflection compensation parameter D2/P2 is used to characterize a reflection ability of the second electrode 23 in the second pixel 2 to the light emitted by the second light-emitting function part 25. Since D2 in the present embodiment is greater than D1 and P2 is equal to P1, the reflection compensation parameter D1/P1 of the first pixel 1 is less than the reflection compensation parameter D2/P2 of the second pixel 2.

In the present embodiment, the display area S is divided into a first display area S1 located in a central area and a second display area S2 located in an edge area. The second display area S2 is an area within 30 mm from the edge of the first display area S1. That is, a distance from a side of the second display area S2 away from the first display area S1 to the first display area S1 is less than or equal to 30 mm.

FIG. 3 shows a brightness attenuation curve when pixels in the display area are set to different reflection compensation parameters. In FIG. 3, a horizontal direction represents a viewing angle of human eyes viewing a measured display area, and a vertical direction represents a brightness attenuation percentage of the measured display area. Specifically, it can be seen that when the measured display area reflection compensation parameter D/P is greater than 1.4, the brightness attenuation of the measured display area under a large viewing angle is alleviated, and an attenuation speed is significantly slower than a rate of brightness decay when the ratio of the reflection compensation parameter is less than 1.4. This is because when the human eyes look at the central area of the display area, a viewing angle of the edge area is larger than viewing angle of the central area. For human eyes, a brightness of the central area attenuates at a small angle, while a brightness of the edge area attenuates at a large angle. At this time, if the reflection compensation parameter D/P of the central area and the edge area are set to be different, and the reflection compensation parameter D/P of the central area is set to be less than the reflection compensation parameter D/P of the edge area, then the large-angle brightness attenuation in the edge area will be alleviated, and a brightness difference between the two areas will be leveled so as to improve sensing experiences.

The reflection compensation parameter of the first pixel 1 arranged on the first display area S1 in the central area of the display area S ranges from 1 to 1.4. The reflection compensation parameter of the second pixel 2 arranged on the second display area S2 in the area surrounding the display area S ranges from 1.4 and 2. Therefore, it is ensured that the brightness attenuation of the edge area of the display area S is slower than the brightness attenuation of the central area of the display area S, thereby improving the visual brightness difference between the edge area and the central area of the display area S due to the difference in viewing angle.

In the present embodiment, by increasing the area of the second electrode 23, the light reflection effect of the second electrode 23 is greater than that of the first electrode 13, and the reflection compensation parameter D1/P1 of the first pixel 1 is less than the reflection compensation parameter D2/P2 of the second pixel 2. Therefore, an intensity of the light emitted by the first pixel 1 is weaker than an intensity of the light emitted by the second pixel 2, so that the brightness attenuation of the first display area S1 where the first pixel 1 is located decays faster than the brightness attenuation of the second display area S2 where the second pixel 2 is located. Through the above design, it can be ensured that the brightness attenuation of the second display area S2 located at the edge of the display area S is less than that of the first display area S1 located at the central area of the display area S, thereby improving the visual brightness difference due to the viewing angle difference between the edge area and the central area of the display area S of the display panel, and resulting in more uniform visual brightness of the display panel.

It can be understood that, in other specific embodiments of the present application, the reflection compensation parameter D2/P2 of the second pixel 2 can also be increased by reducing the opening area of the second opening 142. Specifically, the reflection compensation parameter D2/P2 of the second pixel 2 can be increased by reducing the orthographic projection area P2 of the area connecting the second light-emitting function part 25 and the second electrode 23 on the substrate 3, so that the reflection compensation parameter D2/P2 of the second pixel 2 is greater than the reflection compensation parameter D1/P1 of the first pixel 1. As an opening area of the second opening 142 is reduced, the area connecting the second light-emitting function part 25 and the second electrode 23 is also reduced relative to the second electrode. The light emitted by the second light-emitting function portion 25 arranged on the inclined side wall of the second opening 142 can also be effectively reflected by the second electrode 23, so that the brightness of the second display area S2 where the second pixel 2 is located is attenuated more slowly than the brightness of the first display area S1 where the first pixel 1 is located. Therefore, it can also be ensured that the brightness attenuation of the second display area S2 located at the edge of the display area S is less than that of the first display area S1 located at the central area of the display area S, and the visual brightness difference differences in the display area S edge area and the central area of the display panel are improved due to the difference in viewing angle so that makes the visual brightness of the display panel more uniform.

In the embodiment, the first electrode 13 and the second electrode 23 are anodes. Both the first light-emitting function portion 15 and the second light-emitting function portion 25 comprise a hole injection layer, a hole transporting layer, a light emitting layer, an electron transporting layer, and a cathode which are sequentially arranged on the anode. It can be understood that in other specific embodiments of the present application, the first electrode 13 and/or the second electrode 23 may be a cathode. Correspondingly, when the first electrode 13 is a cathode, the first light-emitting function portion 15 comprises an electron transporting layer, a light-emitting layer, a hole transporting layer, a hole injection layer, and an anode sequentially arranged on the cathode. When the second electrode 23 is a cathode, the second light-emitting function portion 25 comprises an electron transporting layer, a light-emitting layer, a hole transporting layer, a hole injection layer, and an anode sequentially arranged on the cathode. The present application is not specifically limited here.

It can be understood that in other specific embodiments of the present application, in order to improve the visual brightness difference between the edge area and the central area of the display area S due to the difference in viewing angle, the reflection compensation parameter of the pixels on the display area S along the direction from the center of the display area S to the edge of the display area S can be gradually increased in sequence. As a result, in the direction from the center of the display area S to the edge of the display area S, the attenuation of the visual brightness of the pixels gradually decreases, so that the visual brightness of the display panel is more uniform. Specifically, the first display area S1 is close to the central area of the display panel, and the second display area S2 is away from the central area of the display panel. The reflection compensation parameter of the plurality of first pixels 1 in the first display area S1 is gradually increased. The reflection compensation parameter of the plurality of second pixels 2 in the second display area S2 is gradually increased.

Figure 4:
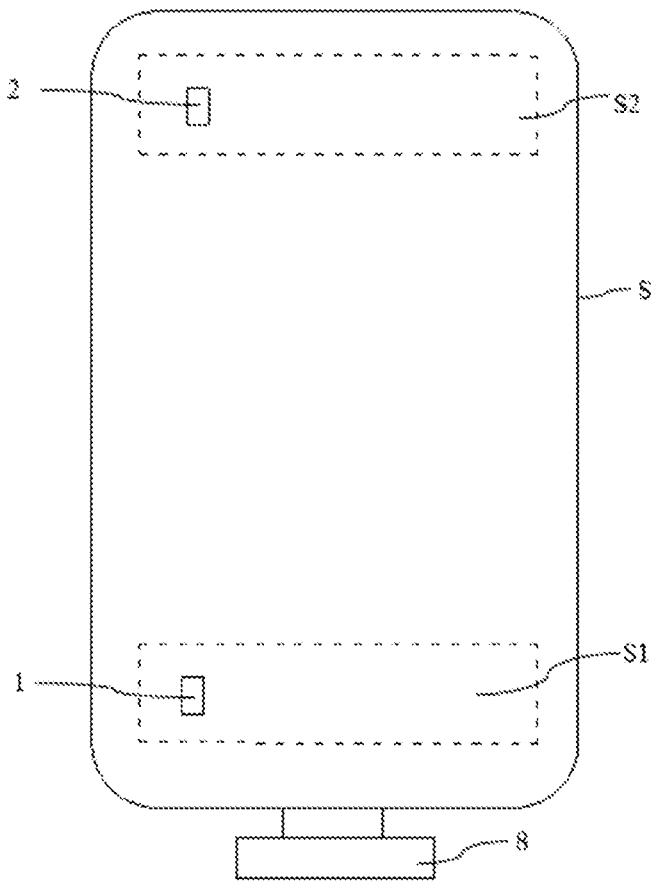
FIG. 4 is a schematic structural diagram of a display area of a display panel provided by a second embodiment of the present application.

A second embodiment provided by this application is shown in FIG. 4. The difference between the present embodiment and the first embodiment is that in order to alleviate the loss caused by the line resistance of a large-size display panel, the first display area S1 is arranged close to the driver chip 8 of the display panel and the second display area S2 is arranged away from the driver chip 8 of the display panel. The first display area S1 is provided with the first pixel 1 as described in the first embodiment. The second display area S2 is provided with the second pixel 2 as described in the first embodiment.

When a driving signal line (not shown in the figure) is too long, a driving signal will be attenuated due to a gradual increase of the line resistance, which will cause the area away from the driver chip 8 to be weakened due to insufficient driving voltage. Through adjusting the reflection compensation parameter D/P of the pixels in the display area S provided by the aforementioned solution, so that the reflection compensation parameter D/P of the first pixel 1 is less than the reflection compensation parameter D/P of the second pixel 2, which can ensure the brightness attenuation of the second display area S2 of the driver chip 8 away from the drive is less than the brightness attenuation of the first display area S1 close to the driver chip 8, which improves the brightness reduction phenomenon of the display area S at the end far away from the driver chip 8, and makes the visual brightness of the display panel more uniform.

It is understandable that the driver chip 8 may be a scanning driver chip, a data driver chip or an LED driver chip used for lighting the light board in the backlight module, which is not specifically limited herein.

It can be understood that, in the specific embodiment of the present application, the first display area S1 and the second display area S2 may be arranged adjacently, or may be arranged at intervals, which is not specifically limited herein.

The present application defines a ratio D/P of the orthographic projection area D of the electrode in each pixel on the substrate to the orthographic projection area P of the area connecting the light-emitting functional layer and the electrode in the pixel on the substrate as a reflection compensation parameter of the pixel. By adjusting the reflection compensation parameter of the pixels on the first display area S1 and/or the second display area S2, the brightness difference between the first display area S1 and the second display area S2 is improved, so that the visual brightness of the display panel is uniform.

Specifically, by setting the reflection compensation parameter of the first pixel arranged on the first display area to be less than the reflection compensation parameter of the second pixel located on the second display area, a brightness attenuation of the second display area is lower than that of the first pixel. The brightness attenuation of the display area is slower to ensure that the brightness attenuation of the second display area located at the edge of the display area is less than that of the first display area located at the center area of the display area, thereby improving the visual appearance caused by the difference in viewing angle between the edge area and the center area of the display area.

The above is a detailed introduction to a mobile terminal provided by an embodiment of the present application. Specific examples are used in this article to illustrate the principles and implementation of the present application. Its core idea, at the same time, for those skilled in the art, according to the idea of this application, there will be changes in the specific implementation and scope of application. In summary, the content of the present specification should not be construed as a limitation to this application.

What is claimed is:

1. A display panel including a plurality of first pixels arranged in a first display area and a plurality of second pixels arranged in a second display area, wherein the display panel comprises:

a substrate;

a thin film transistor layer arranged on the substrate;

an electrode layer arranged on the thin film transistor layer, wherein the electrode layer comprises a plurality of first electrodes arranged in the first display area which correspond to the first pixels, and a plurality of second electrodes in the second display area which correspond to the second pixels; and a light-emitting function layer arranged on the electrode layer, wherein the light-emitting function layer comprises a plurality of first light-emitting function portions arranged in the first display area which correspond to the first pixels, and a plurality second light-emitting function portions arranged in the second display area which correspond to the second pixels;

wherein an orthographic projection area of the first electrode on the substrate is D1, an orthographic projection area of an area connecting the first light-emitting function portion and the first electrode on the substrate is P1, and a reflection compensation parameter of the first pixel is D1/P1;

wherein an orthographic projection area of the second electrode on the substrate is D2, an orthographic projection area of an area connecting the second light-emitting function portion and the second electrode on the substrate is P2, and a reflection compensation parameter of the second pixel is D2/P2; and wherein the reflection compensation parameter of the first pixel is less than the reflection compensation parameter of the second pixel;

wherein the first display area is close to a central area of the display panel, and the second display area is far from the central area of the display panel;

wherein the display panel comprises a plurality of pixels arranged in the display area, the display area comprising the first display area and the second display area; and a reflection compensation parameter of the pixels gradually increases along a direction from a center of the display area to an edge of the display area.

2. The display panel according to claim 1, wherein the reflection compensation parameter of the plurality of the second pixels in the second display area gradually increases along a direction from the center of the display area to the edge of the display area.

3. The display panel of claim 1, wherein the second display area surrounds the first display area.

4. The display panel of claim 3, wherein the second display area is adjacent to the first display area, and a side of the second display area away from the first display area is in a distance of less than or equal to 30 mm to the first display area.

5. The display panel of claim 1, wherein the reflection compensation parameter of the first pixels ranges from 1 to 1.4, and the reflection compensation parameter of the second pixels ranges from 1.4 to 2.

6. The display panel of claim 1, wherein the P1 is equal to the P2, and the D1 is less than the D2.

7. The display panel of claim 6, further comprising a pixel definition layer arranged on the electrode layer, and the pixel definition layer is provided with a first opening and a second opening along a thickness direction;
wherein the first light-emitting function portion is arranged in the first opening, the first opening exposes the first electrode, the first light-emitting function portion is connected to the first electrode through the first opening;
wherein the second light-emitting function portion is arranged in the second opening, the second opening exposes the second electrode, the second light-emitting function portion is connected to the second electrode through the second opening; and
wherein an opening size of the first opening is the same as an opening size of the second opening.

8. The display panel of claim 1, further comprising a driver chip, wherein the driver chip is arranged close to the first display area, and the driver chip is away from the second display area.

9. A display panel including a plurality of first pixels arranged in a first display area and a plurality of second pixels arranged in a second display area, wherein the display panel comprises:
a substrate;
a thin film transistor arranged on the substrate;
a first electrode arranged on the thin film transistor, wherein a plurality of first electrodes are arranged in the first display area which correspond to the first pixels;
a second electrode arranged on a layer the same as the first electrode, wherein a plurality of second electrodes are arranged in the second display area which correspond to the second pixels;
a first light-emitting function layer arranged on the first electrode and corresponding to the first pixels, wherein a plurality of first light-emitting function portions are arranged in the first display area; and
a second light-emitting function layer arranged on the second electrode and corresponding to the second pixels, wherein a plurality of second light-emitting function portions are arranged in the second display area;
wherein an orthographic projection area of the first electrode on the substrate is D1, an orthographic projection area of an area connecting the first light-emitting function portion and the first electrode on the substrate is P1, and a reflection compensation parameter of the first pixel is D1/P1;
wherein an orthographic projection area of the second electrode on the substrate is D2, an orthographic projection area of an area connecting the second light-emitting function portion and the second electrode on the substrate is P2, and a reflection compensation parameter of the second pixel is D2/P2;
wherein the reflection compensation parameter of the first pixel is less than the reflection compensation parameter of the second pixel; and
wherein the first display area is close to a central area of the display panel, and the second display area is far from the central area of the display panel;
wherein the display panel comprises a driver chip, wherein the driver chip is arranged close to the first display area, and the driver chip is away from the second display area.

10. The display panel according to claim 9, further comprising a plurality of pixels arranged in the display area, the display area comprising the first display area and the second display area; and
a reflection compensation parameter of the pixels gradually increases along a direction from a center of the display area to an edge of the display area.

11. The display panel of claim 10, wherein the reflection compensation parameter of the plurality of the second pixels in the second display area gradually increases along a direction from the center of the display area to the edge of the display area.

12. The display panel of claim 9, wherein the second display area surrounds the first display area.

13. The display panel of claim 12, wherein the second display area is adjacent to the first display area, and a side of the second display area away from the first display area is in a distance of less than or equal to 30 mm to the first display area.

14. The display panel of claim 9, wherein the reflection compensation parameter of the first pixels ranges from 1 to 1.4, and the reflection compensation parameter of the second pixels ranges from 1.4 to 2.

15. The display panel of claim 9, wherein the P1 is equal to the P2, and the D1 is less than the D2.

16. The display panel of claim 15, further comprising a pixel definition layer arranged on the electrode layer, and the pixel definition layer is provided with a first opening and a second opening along a thickness direction;
wherein the first light-emitting function portion is arranged in the first opening, the first opening exposes the first electrode, the first light-emitting function portion is connected to the first electrode through the first opening;
wherein the second light-emitting function portion is arranged in the second opening, the second opening exposes the second electrode, the second light-emitting function portion is connected to the second electrode through the second opening; and
wherein an opening size of the first opening is the same as an opening size of the second opening.

17. A display panel including a plurality of first pixels arranged in a first display area and a plurality of second pixels arranged in a second display area, wherein the display panel comprises:
a substrate;
a thin film transistor layer arranged on the substrate;
an electrode layer arranged on the thin film transistor layer, wherein the electrode layer comprises a plurality of first electrodes arranged in the first display area which correspond to the first pixels, and a plurality of second electrodes in the second display area which correspond to the second pixels; and
a light-emitting function layer arranged on the electrode layer, wherein the light-emitting function layer comprises a plurality of first light-emitting function portions arranged in the first display area which correspond to the first pixels, and a plurality second light-emitting function portions arranged in the second display area which correspond to the second pixels;

wherein an orthographic projection area of the first electrode on the substrate is D1, an orthographic projection area of an area connecting the first light-emitting function portion and the first electrode on the substrate is P1, and a reflection compensation parameter of the first pixel is D1/P1;

wherein an orthographic projection area of the second electrode on the substrate is D2, an orthographic projection area of an area connecting the second light-emitting function portion and the second electrode on the substrate is P2, and a reflection compensation parameter of the second pixel is D2/P2; and wherein the reflection compensation parameter of the first pixel is less than the reflection compensation parameter of the second pixel;

wherein the display panel comprises a driver chip, wherein the driver chip is arranged close to the first display area, and the driver chip is away from the second display area.

18. The display panel of claim 17, wherein the reflection compensation parameter of the first pixels ranges from 1 to 1.4, and the reflection compensation parameter of the second pixels ranges from 1.4 to 2.

19. The display panel of claim 17, wherein the P1 is equal to the P2, and the D1 is less than the D2.

20. The display panel of claim 19, further comprising a pixel definition layer arranged on the electrode layer, and the pixel definition layer is provided with a first opening and a second opening along a thickness direction;

wherein the first light-emitting function portion is arranged in the first opening, the first opening exposes the first electrode, the first light-emitting function portion is connected to the first electrode through the first opening;

wherein the second light-emitting function portion is arranged in the second opening, the second opening exposes the second electrode, the second light-emitting function portion is connected to the second electrode through the second opening; and wherein an opening size of the first opening is the same as an opening size of the second opening.

* * * * *